United States Patent
Patti et al.

(10) Patent No.: US 7,528,461 B2
(45) Date of Patent: May 5, 2009

(54) BIPOLAR POWER TRANSISTOR AND RELATED INTEGRATED DEVICE WITH CLAMP MEANS OF THE COLLECTOR VOLTAGE

(75) Inventors: Davide Patti, Catania (IT); Sebastiano Aparo, Solarino (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 212 days.

(21) Appl. No.: 11/423,335

(22) Filed: Jun. 9, 2006

(65) Prior Publication Data

US 2007/0013032 A1    Jan. 18, 2007

(30) Foreign Application Priority Data

Jun. 10, 2005   (IT) .......................... VA2005A0038

(51) Int. Cl.
   *H01L 29/73*   (2006.01)
(52) U.S. Cl. .............................. 257/578; 257/E29.174; 257/E29.183
(58) Field of Classification Search ................. 257/578, 257/E29.183; 438/20, 170, 189, 202, 234, 438/309
See application file for complete search history.

(56) References Cited

U.S. PATENT DOCUMENTS

| | | | | |
|---|---|---|---|---|
| 5,661,329 | A  * | 8/1997 | Hiramoto et al. | 257/510 |
| 5,665,994 | A  * | 9/1997 | Palara | 257/378 |
| 6,815,779 | B1 * | 11/2004 | Torres et al. | 257/373 |
| 2004/0016960 | A1 * | 1/2004 | Aiello et al. | 257/328 |
| 2004/0110353 | A1 * | 6/2004 | Mallikarjunaswamy | 438/309 |

\* cited by examiner

*Primary Examiner*—Lynne A. Gurley
*Assistant Examiner*—Vernon P Webb
(74) *Attorney, Agent, or Firm*—Lisa K. Jorgenson; Allen, Dyer, Doppelt, Milbrath & Gilchrist, P.A.

(57) ABSTRACT

A bipolar power transistor does not include integration of a Zener diode electrically connected between the base and collector for limiting the collector voltage. The power transistor is formed in a substrate, and includes an equalization diffusion and an auxiliary diffusion forming a P-N junction along a perimeter of the substrate. An equalization conduction layer is in contact with the equalization diffusion and the auxiliary diffusion for electrically shorting the P-N junction.

15 Claims, 5 Drawing Sheets

BIPOLAR POWER TRANSISTOR AND RELATED INTEGRATED DEVICE WITH CLAMP MEANS OF THE COLLECTOR VOLTAGE

FIELD OF THE INVENTION

The present invention relates to power transistors, and more particularly, to a power transistor in which a collector voltage is clamped without using Zener diodes coupled between the collector and the base nodes.

BACKGROUND OF THE INVENTION

Generally, power transistors formed in VIPower technology, for example, are integrated on the same silicon substrate with components that prevent the collector voltage on the power transistor from reaching potentially dangerous levels.

In particular, when the power transistor is connected with an inductive load, it is necessary to clamp the collector voltage for preventing excessively large voltages from developing on the transistor because of abrupt variations of the current absorbed by the load. A Zener diode (or a plurality of diodes connected in series) is integrated between the collector and the base of the power transistor for an NPN power transistor, as shown in FIG. 1. Whenever the collector-emitter voltage exceeds a certain maximum value, the Zener diode (or diodes) starts conducting. This provides a by-pass path for the current.

Typically, a power transistor is formed by a collector region 1 of a relatively low bulk resistivity on the back of a monocrystalline silicon substrate contacted by a metal collector (COLLECTOR), as shown in FIG. 2.

The lighter doped portion of the substrate 2 has a dopant concentration and thickness so that the transistor can withstand a design breakdown voltage that may be generally between 600V and 1,200V.

On the front side of the substrate is a diffused buried base region 3 doped with a dopant of an opposite type of conductivity to that of the collector region 1. In the buried base region 3 is a buried emitter region 4 of the same type of conductivity as the collector region 1. An epitaxial layer 5 having a thickness ranging between 5 μm and 10 μm is grown over the buried regions 3 and 4.

Base and emitter contact diffusions 6 and 7 are formed with photolithographic and diffusion processes. These contact diffusions extend in depth from the outer surface of the epitaxial layer 5 to the respective base and emitter buried regions 3 and 4. The respective metal contacts BASE and EMITTER are formed on the base and emitter contact diffusions.

A sample layout of a monolithic semiconductor power device formed in VIPower technology is depicted in FIG. 3. The power transistor NPN POWER comprises a control stage DRIVER STAGE and a final stage FINAL STAGE. The Zener diodes ZENER CHAIN are connected in series between the collector and the base according to the scheme of FIG. 1. A circuit THERMAL COMPENSATION CELL stabilizes the clamp voltage at which the Zener diodes start conducting versus temperature variations.

Outside the active area along the perimeter of the layout, there is an equalization metal ring EQR that is formed to equalize the potential in the whole semiconductor substrate. Typically, this metal layer contacts a superficial region 8 that is heavily doped with a dopant having the same type of conductivity as the collector region 1, hereinafter called the EQR contact region. Between the collector region 1, the substrate 2 and the EQR contact region 8 there is not any P-N junction. Thus, the latter region is practically at the same potential as the collector region. The EQR metal ensures that the whole substrate on which the power transistor is integrated is at a uniform collector potential.

The series of Zener diodes ZENER CHAIN occupy a relatively large silicon surface that increases the cost of the device. It is not possible to reduce the dimensions of the Zener diodes beyond a certain limit because they need to be capable of carrying relatively large currents, without being damaged when the collector voltage exceeds a maximum pre-established threshold.

SUMMARY OF THE INVENTION

In view of the foregoing background an object of the present invention is to provide an integrated power transistor with means or circuitry for clamping the collector voltage that can be formed on a reduced silicon area.

This and other objects, features and advantages in accordance with the present invention are provided by an integrated bipolar power transistor with means or circuitry for clamping its collector voltage while occupying a significantly reduced silicon area compared to the transistors of known VIPower devices. Moreover, the clamp voltage may be fixed with enhanced precision when using Zener diodes.

Thorough investigations carried out by the inventors lead to recognition that it is not necessary to integrate Zener diodes in power devices for limiting collector voltage, contrarily to what is commonly done. But it is possible to obtain the same result with a power transistor using a different structure that allows exploitation of the peripheral part of the layout on which the EQR metal ring and the EQR diffusion are formed.

An auxiliary diffused region is formed in the epitaxial layer of the transistor at least partly underneath the EQR metal ring adjacent the inner side of the EQR diffusion. The diffused auxiliary region is of the same type of conductivity as the base contact diffusion, and is laterally spaced from the base contact diffusion in the epitaxial region. This auxiliary diffusion forms with the EQR diffusion a P-N junction that is shorted by the top equalization metal layer of the EQR ring.

The collector voltage of the power transistor formed within the active area surrounded by the EQR perimeter structure may be limited to a maximum value because, when this voltage reaches a certain level, the epitaxial region that separates the base contact diffusion from the auxiliary diffusion is completely depleted and a current may flow therethrough by the punch-through mechanism. When the collector voltage rises to a value sufficiently high to deplete the epitaxial region, a relatively intense base-collector current flows therethrough effectively preventing a further increase of the collector voltage.

According to the preferred embodiment, the shorted P-N junction may be formed in a perimeter portion of the layout of the integrated device, practically bordering the active area of integration of the power transistor structure

DETAILED DESCRIPTION OF THE PREFERRED EMBODIMENTS

Figure 1:
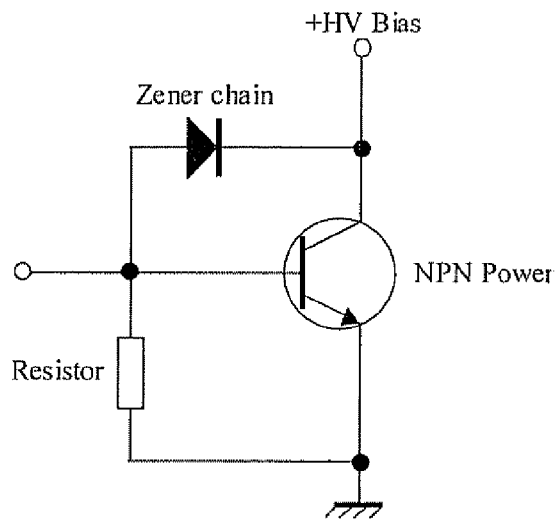
FIG. 1 illustrates a typical NPN power transistor circuit including a clamping Zener diode connected between the collector and base in accordance with the prior art.
Figure 2:
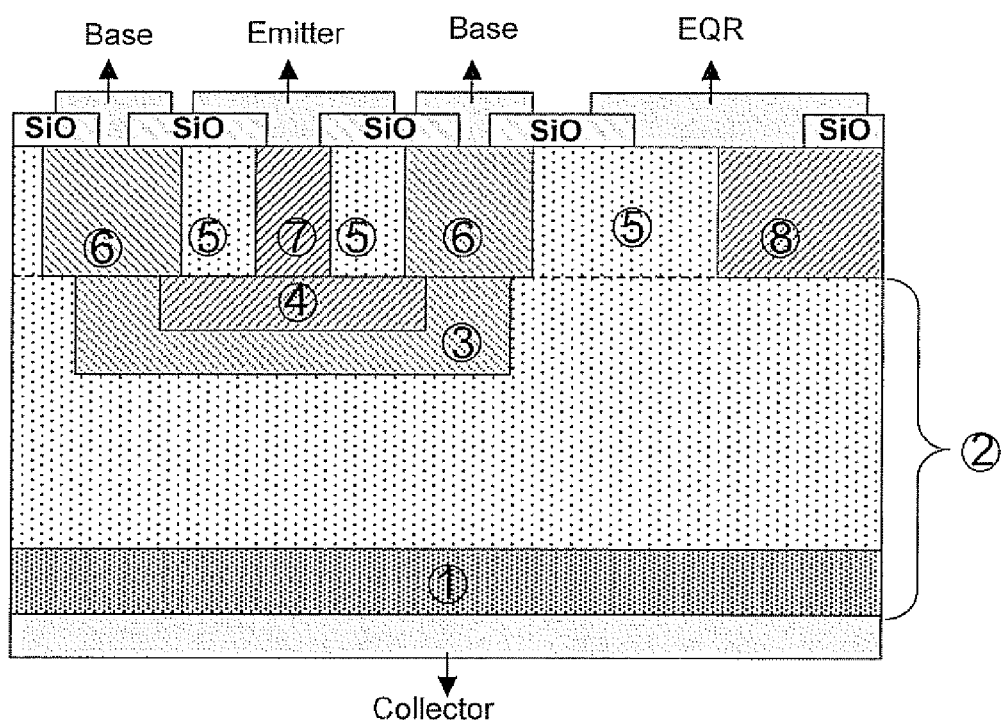
FIG. 2 illustrates a sectional view of a power transistor structure and the perimeter EQR structure in accordance with the prior art.
Figure 3:
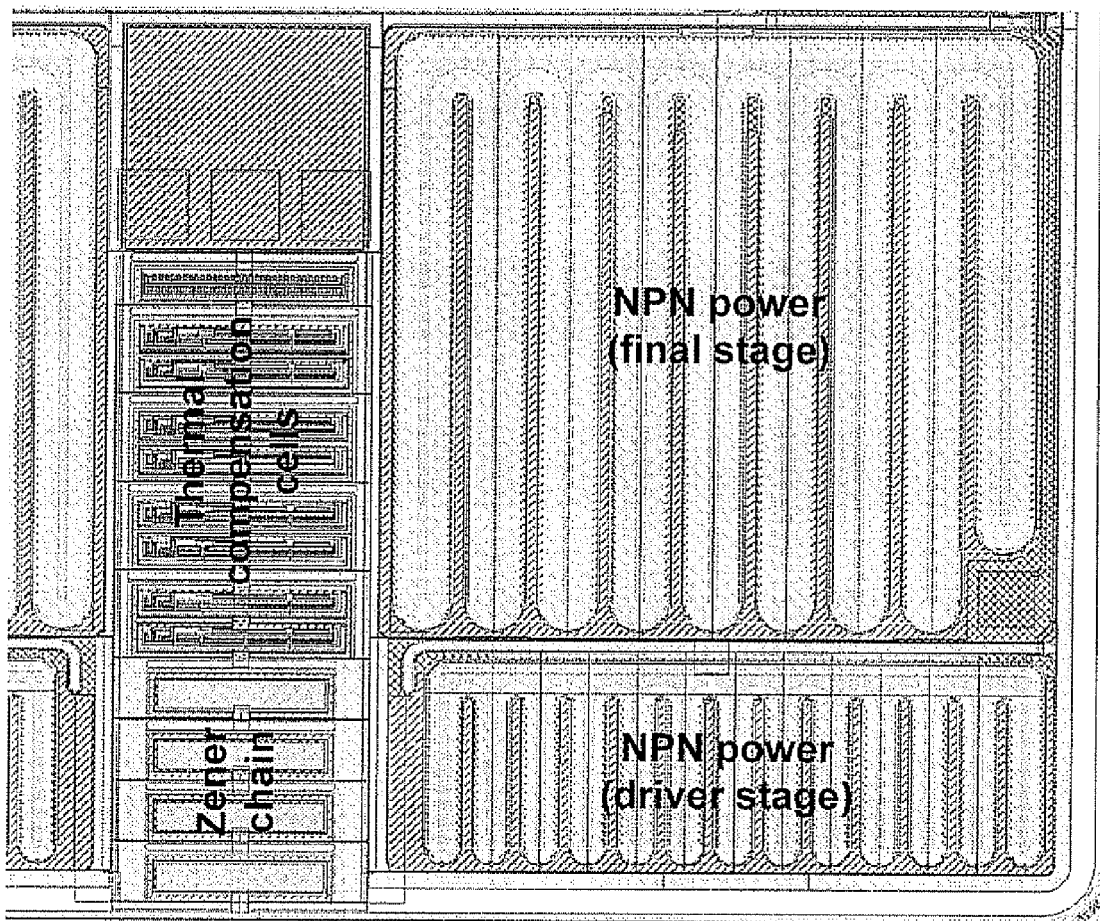
FIG. 3 illustrates a typical layout of the integrated power device of FIGS. 1 and 2.
Figure 4:
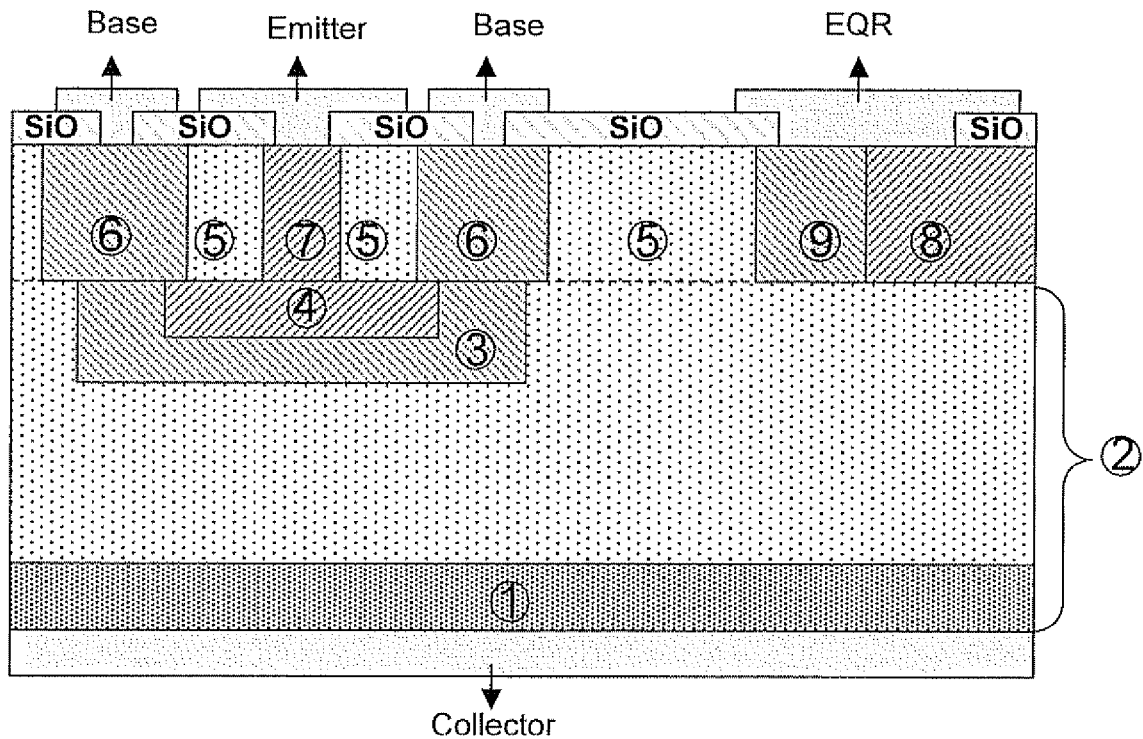
FIG. 4 illustrates a sectional view of the structure of a power transistor including circuitry for clamping the collector voltage in accordance with the present invention.

The architecture of the transistor in accordance with the present invention is shown in FIG. 4. Compared with the known structure of FIG. 2, the bipolar power transistor in FIG. 4 has an auxiliary diffused region 9 formed in the epitaxial layer. The auxiliary diffused region 9 has the same type of conductivity as the base region 6, and is laterally spaced from it with epitaxial region 5 therebetween. The auxiliary diffused region 9 forms a P-N junction with the EQR diffusion 8.

The EQR metal layer tops both diffusions 8 and 9 and electrically shorts the P-N junction. Thus, underneath the auxiliary region 9 will be at the same potential of the EQR region 8.

When the power transistor is off, there is a voltage difference between the base region 6 and the EQR region 8 that produces in the epitaxial region that separates the base diffusion 6 from the EQR structure a zone or region proportionately depleted from the charge carriers. If the collector voltage reaches a certain value, the depletion zone in the epitaxial region extends in the region 5 between the base diffusion 6 and the auxiliary diffusion 9. When completely depleted from side to side, a punch-through phenomenon occurs that practically creates a charge carrier flow path bridging across the width of the epitaxial region 5 from the EQR structure to the base region 6.

Figure 5:
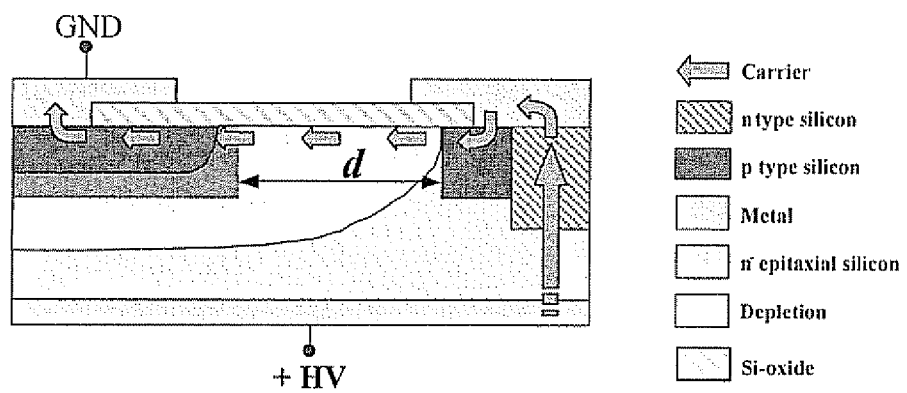
FIG. 5 illustrates a path of the charge carriers in the integrated structure of a power transistor in accordance with the present invention.

This situation is schematically shown in FIG. 5. The NPN transistor is turned off by connecting its base to a node at a ground potential GND, and connecting its collector to a positive voltage HV. The arrows show the flow path of the punch-through current across the spacing (d) epitaxial region 5.

The collector voltage at which the punch-through phenomenon starts is a function of the thickness and of the dopant concentration of the epitaxial region 5. This may be established with great precision within a relatively large range.

The power transistor of FIG. 4 does not require the integration of a Zener diode electrically connected between the base and the collector for limiting the collector voltage. Thus, a device that includes the integrated power transistor will occupy a smaller silicon area than the known device as shown in FIG, 2.

Figure 6:
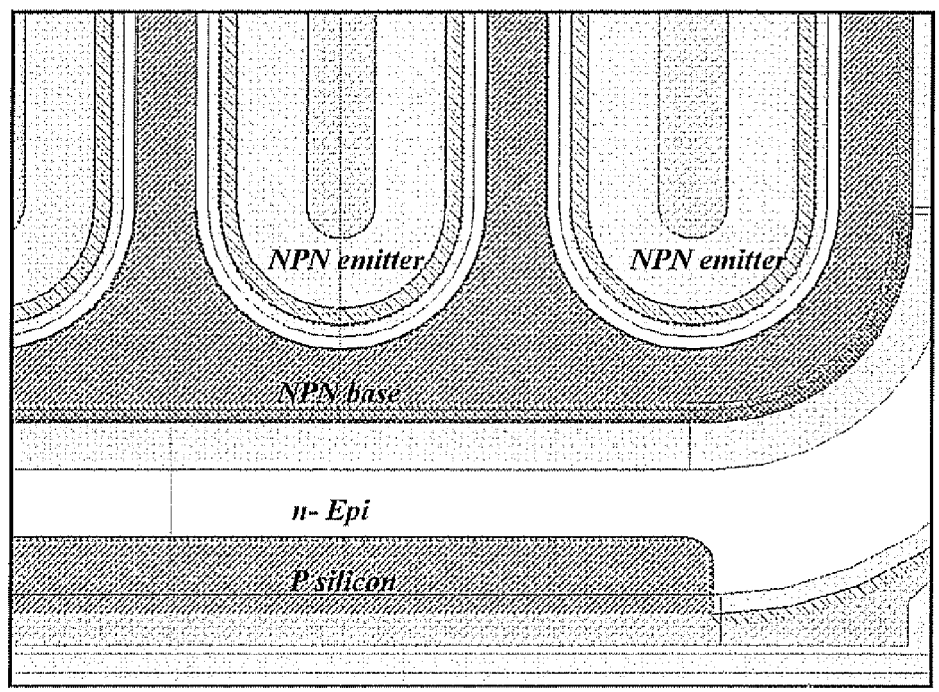
FIG. 6 illustrates an enlarged feature of the layout of an integrated power device in accordance with the present invention.
Figure 7:
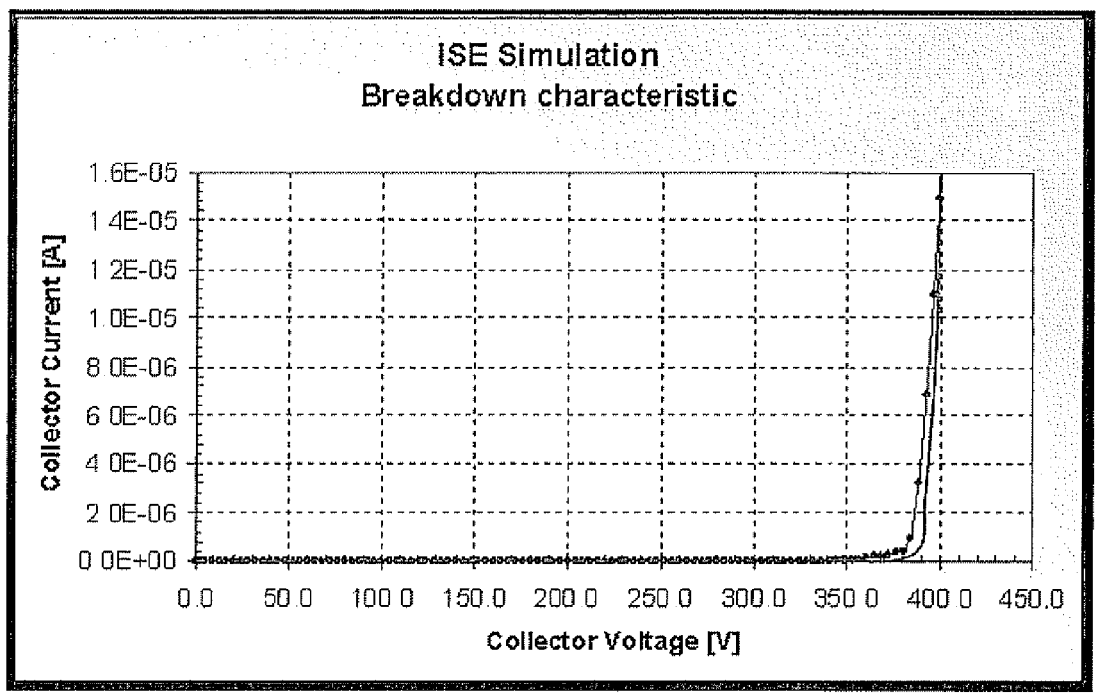
FIG. 7 is a graph comparing simulated and real characteristics of a power transistor in accordance with the present invention

Moreover, the auxiliary region 9 is formed in a peripheral part of the layout of the device, and underneath the EQR metal ring as schematically shown in the detail view of FIG. 6. Therefore, the auxiliary region 9 does not require any additional area of integration The functioning of the NPN transistor has been simulated with the simulators ISE™ and SILVACO™. Simulated and real graphs of the collector current as a function of the collector voltage for a sample three-dimensional power transistor structure having a dept of 1 μm are depicted in FIG. 7.

The graphs of the simulated and true voltage-current characteristics practically coincide and show that, at a voltage of 400V, the collector current increases very rapidly in correspondence to small increments of the collector voltage. As a consequence, even if the transistor is used for supplying an inductive load, the collector voltage would not significantly exceed 400V.

Figure 8:
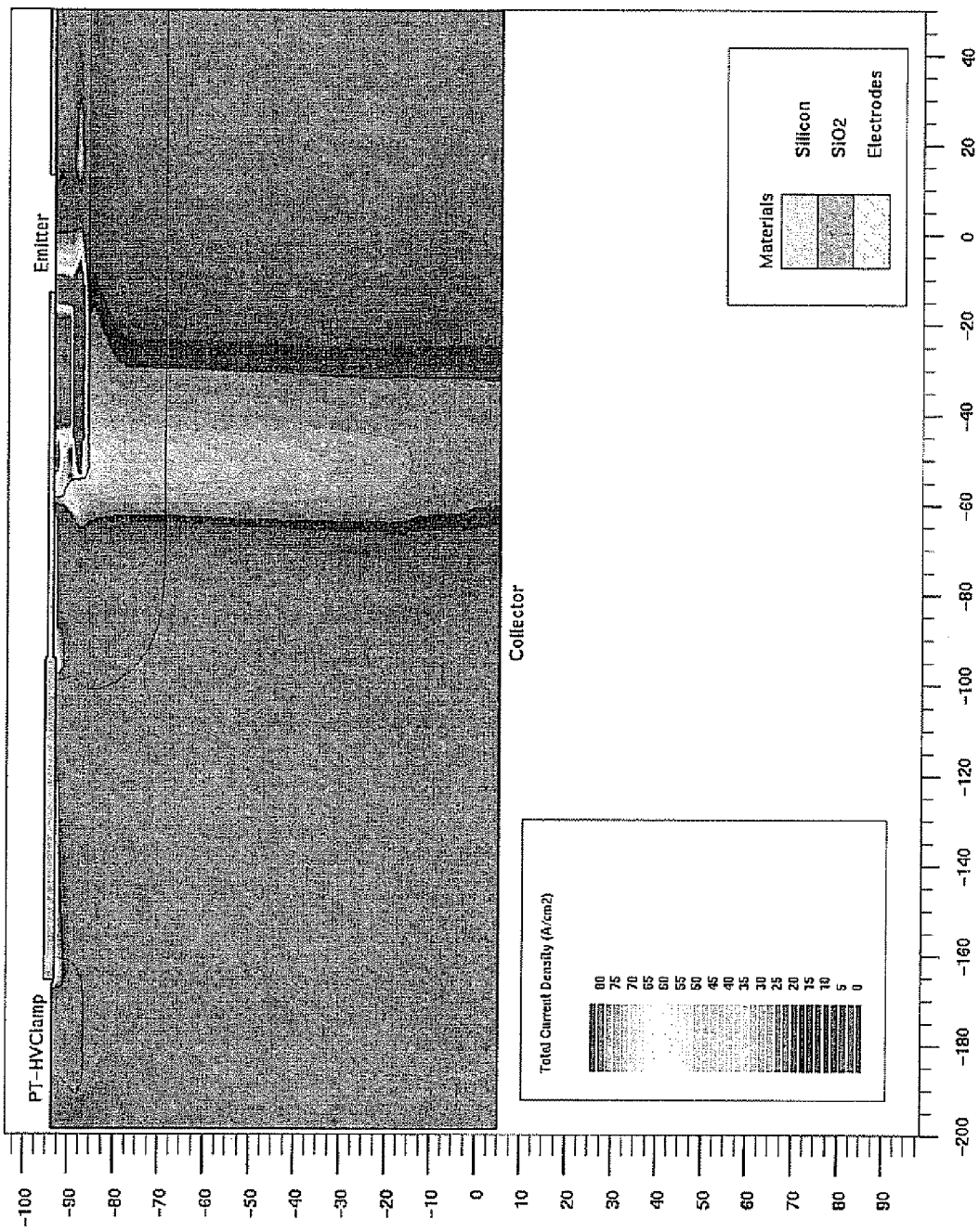
FIG. 8 illustrates the current distribution within the transistor structure for the simulations of FIG. 7.

FIG. 8 shows the distribution of the current in the substrate at the collector voltage (that in the specific case is 400V), at which the punch-through phenomenon starts. The regions of the transistor may have the following size and dopant concentrations: the size of the emitter area may range from several $mm^2$ to a few tenths of $mm^2$, and the dopant concentration of the emitter is about $10^{19}$ atoms/$cm^{-3}$.

The innovative structure of the transistor achieves the following advantages with respect to comparable known devices. There is a reduction of a silicon area requirement for the same voltage rating of the power transistor There is a smaller dynamic resistance when the collector voltage is clamped than that obtainable with known techniques. There is a reduction of the leakage at the collector voltage level at which punch-through begins. There is a possibility of turning on again the power transistor from different locations of the base region without incrementing the silicon area of integration to increase the allowed switching energy. By permitting turn on of the transistor from a plurality of different locations of the base region, it is possible to balance the voltage on the base/emitter junction to prevent current density focalizations or to turn on the transistor in limited portions of its integrated structure.

That which is claimed:

1. A bipolar power transistor comprising:
    a substrate having a first type of conductivity;
    a collector diffusion having the first type of conductivity on a back side of said substrate;
    a first buried base region having a second type of conductivity on a front side of said substrate;
    a first buried emitter region having the first type of conductivity in said first buried base region;
    an epitaxial layer on an upper surface of said first buried base region, an upper surface of said first buried emitter region and an upper surface of said substrate;
    a base contact diffusion and an emitter contact diffusion respectively having the second and first type of conductivities, and extending through said epitaxial layer for respectively contacting said first buried base region and said first buried emitter region;
    an equalization diffusion having the first type of conductivity and extending through said epitaxial layer and contacting said substrate;
    an auxiliary diffusion having the second type of conductivity and extending through said epitaxial layer and laterally spaced from said first base region, said auxiliary diffusion forming with said equalization diffusion a junction; and
    an equalization conduction layer in contact with said equalization diffusion and said auxiliary diffusion for electrically shorting the junction.

2. A bipolar power transistor according to claim 1 wherein said substrate comprises a monocrystalline silicon substrate.

3. A bipolar power transistor according to claim 1 wherein the first type of conductivity comprises an N-type conductivity and the second type of conductivity comprises a P-type conductivity so that the bipolar power transistor is configured as an NPN power transistor.

4. A bipolar power transistor according to claim 1 wherein said equalization diffusion extends along a perimeter of said substrate.

5. A bipolar power transistor according to claim 4 wherein said auxiliary diffusion contacts said equalization diffusion and also extends along the perimeter of said substrate.

6. An integrated monolithic power device comprising:
at least one power transistor comprising
a substrate having a first type of conductivity,
a collector diffusion having the first type of conductivity on a back side of said substrate,
a first buried base region having a second type of conductivity on a front side of said substrate,
a first buried emitter region having the first type of conductivity in said first buried base region,
an epitaxial layer on an upper surface of said first buried base region, an upper surface of said first buried emitter region and an upper surface of said substrate,
a base contact diffusion and an emitter contact diffusion respectively having the second and first type of conductivities, and extending through said epitaxial layer for respectively contacting said first buried base region and said first buried emitter region; and
at least one device for clamping a collector voltage of said power transistor comprising
an equalization diffusion having the first type of conductivity and extending through said epitaxial layer and contacting said substrate,
an auxiliary diffusion having the second type of conductivity and extending through said epitaxial layer and laterally spaced from said first base region, said auxiliary diffusion forming with said equalization diffusion a junction, and
an equalization conduction layer in contact with said equalization diffusion and said auxiliary diffusion for electrically shorting the junction.

7. An integrated monolithic power device according to claim 6 wherein the junction extends along a perimeter of said substrate.

8. An integrated monolithic power device according to claim 6 wherein said substrate comprises a monocrystalline silicon substrate.

9. An integrated monolithic power device according to claim 6 wherein the first type of conductivity comprises an N-type conductivity and the second type of conductivity comprises a P-type conductivity so that the power transistor is configured as an NPN power transistor.

10. An integrated monolithic power device according to claim 6 that is void of a Zener diode between said first buried base region and said collector diffusion.

11. A method for making a power transistor comprising:
forming a collector diffusion having a first type of conductivity on a back side of a substrate having the first type of conductivity;
forming a first buried base region having a second type of conductivity on a front side of the substrate;
forming a first buried emitter region having the first type of conductivity in the first buried base region;
forming an epitaxial layer on an upper surface of the first buried base region, an upper surface of the first buried emitter region and an upper surface of the substrate;
forming a base contact diffusion and an emitter contact diffusion respectively having the second and first type of conductivities, and extending through the epitaxial layer for respectively contacting the first buried base region and the first buried emitter region;
forming an equalization diffusion having the first type of conductivity and extending through the epitaxial layer and contacting the substrate;
forming an auxiliary diffusion having the second type of conductivity and extending through the epitaxial layer and laterally spaced from the first base region, the auxiliary diffusion forming with the equalization diffusion a junction; and
forming an equalization conduction layer in contact with the equalization diffusion and the auxiliary diffusion for electrically shorting the junction.

12. A method according to claim 11 wherein the substrate comprises a monocrystalline silicon substrate.

13. A method according to claim 11 wherein the first type of conductivity comprises an N-type conductivity and the second type of conductivity comprises a P-type conductivity so that the power transistor is configured as an NPN power transistor.

14. A method according to claim 11 wherein the equalization diffusion extends along a perimeter of the substrate.

15. A method according to claim 14 wherein the auxiliary diffusion contacts the equalization diffusion and also extends along the perimeter of the substrate.

* * * * *